United States Patent
Oh

(10) Patent No.: US 7,361,452 B2
(45) Date of Patent: Apr. 22, 2008

(54) METHODS FOR FORMING A METAL LINE IN A SEMICONDUCTOR MANUFACTURING PROCESS

(75) Inventor: Sang Hun Oh, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 514 days.

(21) Appl. No.: 10/764,905

(22) Filed: Jan. 26, 2004

(65) Prior Publication Data

US 2004/0157165 A1    Aug. 12, 2004

(30) Foreign Application Priority Data

Feb. 4, 2003    (KR)    ............. 10-2003-0006889

(51) Int. Cl.
*G03F 7/00* (2006.01)
(52) U.S. Cl. .............. 430/311; 430/313; 430/394
(58) Field of Classification Search .......... 430/311, 430/394, 313
See application file for complete search history.

(56) References Cited

U.S. PATENT DOCUMENTS

| 5,652,182 | A | | 7/1997 | Cleeves | |
|---|---|---|---|---|---|
| 5,710,061 | A | | 1/1998 | Cleeves | |
| 5,869,379 | A | * | 2/1999 | Gardner et al. | 438/305 |
| 6,159,840 | A | * | 12/2000 | Wang | 438/618 |
| 6,221,704 | B1 | * | 4/2001 | Furukawa et al. | 438/197 |
| 6,737,725 | B2 | * | 5/2004 | Nitta et al. | 257/522 |

FOREIGN PATENT DOCUMENTS

| JP | 02-047840 | * | 2/1990 |
|---|---|---|---|
| KR | 2001-0059161 | | 7/2001 |
| KR | 2003-0000483 | | 1/2003 |

OTHER PUBLICATIONS

Eun Seok Hong; Method for Manufacturing Semiconductor Device; Korean Patent Abstracts; Publication No. 1020030000483; Publication Date: Jan. 6, 2003; Korean Intellectual Property Office.

Byeong Hak Lee; Method for Forming Metallic Wiring of Semiconductor Device; Korean Patent Abstracts; Publication No. 1020010059161; Publication Date: Jul. 6, 2001; Korean Intellectual Property Office.

Stanley Wolf, Ph.D.; Silicon Processing for the VLSI Era, vol. 4; Deep-Submicron Process Technology; 2002; pp. 322-323 and 458-462; Lattice Press, Sunset Beach, California.

* cited by examiner

*Primary Examiner*—Mark F. Huff
*Assistant Examiner*—Caleen O. Sullivan
(74) *Attorney, Agent, or Firm*—Andrew D. Fortney

(57) ABSTRACT

In a disclosed method for manufacturing a semiconductor device, a lower insulating layer, a lower metal line and an upper insulating layer are sequentially stacked. A first photosensitive film is patterned on the upper insulating layer and the upper insulating layer is subsequently etched. The photosensitive film is removed. An etched portion of the upper insulating layer is then filled with a nitride film. The upper insulating layer is then removed. A second photosensitive film is then patterned and the lower metal line is subsequently etched. An IMD layer is deposited over the resultant construct, thereby forming an air gap within the IMD layer. The IMD layer is planarized. The nitride film is then etched away to thereby form a hole in the IMD layer. The hole is filled with a conductive material to form a contact plug. An upper metal line is deposited over the resultant construct.

7 Claims, 4 Drawing Sheets

METHODS FOR FORMING A METAL LINE IN A SEMICONDUCTOR MANUFACTURING PROCESS

FIELD OF THE DISCLOSURE

The present disclosure relates to semiconductor devices; and, more particularly, to methods for forming an air gap in a semiconductor metal line manufacturing process to manufacture a semiconductor device exhibiting low capacitance.

BACKGROUND

Recently, semiconductor devices are being manufactured such that metal lines are formed on every layer of a multi-layered structure. The distance between vertically adjacent metal lines on an upper layer and a lower layer of the multi-layered structure is getting smaller. Additionally, the gap between metal lines placed on the same layer has been narrowed. For example, the distance between horizontally adjacent metal lines located on the same layer is getting smaller. As a result of these changes, semiconductor devices have become even more highly integrated.

The small distances between vertically or horizontally adjacent metal lines considerably affects the parasitic resistance and the parasitic capacitance between the metal lines in the multi-layered structure. The parasitic resistance and the parasitic capacitance are highly likely to deteriorate electrical characteristics of the associated device, especially, a VLSI (Very Large Scaled Integration) semiconductor device. Furthermore, the level of power consumption and the amount of signal leakage of the device may be increased due to an (RC) delay introduced by the parasitic resistance and capacitance.

Therefore, it is very important to develop a wiring technique for constructing a highly efficient multi-layered metal lines structure exhibiting a low RC value in a VLSI semiconductor device. In order to construct the highly efficient multi-layered metal lines structure, it is required to form a wiring layer by employing a metal having a low resistivity or to use an insulating film exhibiting a low permittivity.

Thus, research has been reported for reducing the capacitance of materials exhibiting low permittivities, (for example, SiO series in oxide of existing TEOS series). However, it is difficult to employ such materials in actual processing because the materials exhibiting low permittivities are not identified yet.

Alternatively, an air gap technique which serves to exhibit low permittivity in spite of applying a conventionally used material has been widely studied. Specifically, when employing air exhibiting a very low permittivity of 1, the parasitic capacitance seen at the multi-layered metal lines structure can be reduced in a VLSI semiconductor device and a low permittivity can be obtained by forming an air gap while using the existing TEOS (Tetra Ethyl Ortho Silicate) series.

However, the conventional air gap forming method has a problem in that an irregular air gap may be formed.

Referring to FIG. 1, a conventional air gap forming process in a semiconductor metal line manufacturing method is represented. A via plug 108 is formed between a lower metal line 102 and a top metal line 116. If the via plug 108 is misaligned with the lower metal line 102, a metal stringer A may remain around an air gap 114, thereby shorting the bottom and the top metal lines 102 and 116. In other words, a bad air gap may be formed because the via process is carried out after forming the air gap 114.

DETAILED DESCRIPTION

FIGS. 2A to 2G are cross-sectional views illustrating an example sequence of processes for forming an air gap in an example semiconductor metal line manufacturing method.

Figure 1:
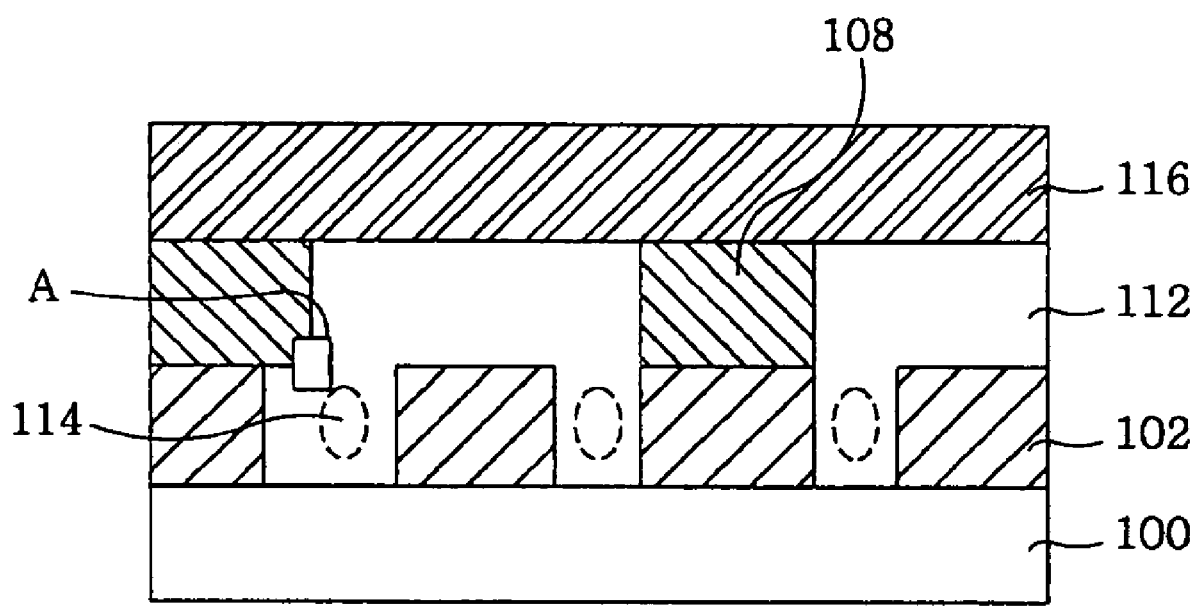
FIG. 1 is a cross-sectional view of a semiconductor device illustrating a conventional air gap forming process.
Figure 2A:
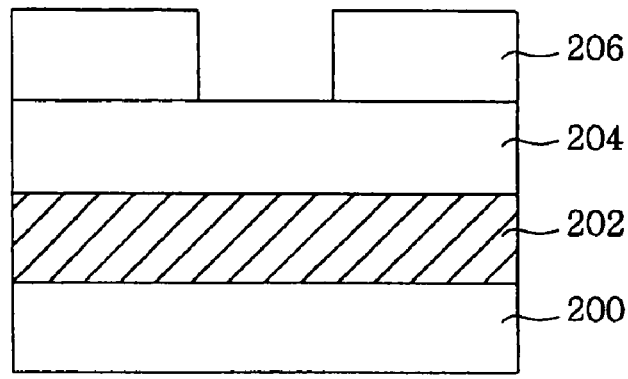
FIGS. 2A to 2G are cross-sectional views of an example semiconductor device illustrating a sequence of example processes for forming an air gap in an example semiconductor metal line manufacturing method.

In the example of FIG. 2A, a lower metal line 202 is stacked on a lower insulating layer 200, (e.g., a silicon substrate coated with an oxide thereof). An upper insulting layer 204 is laid on the lower metal line 202, and then a first photosensitive film 206 is patterned on the upper insulating layer 204.

Figure 2B:
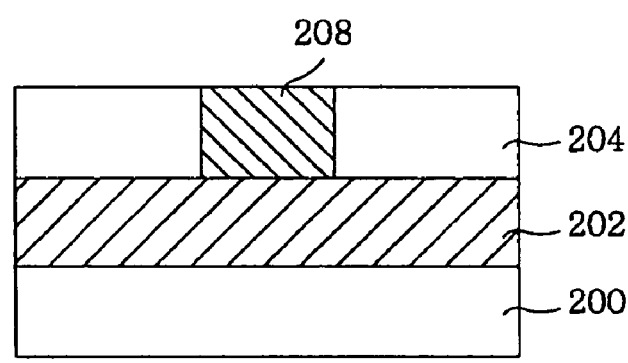
Figure 2C:
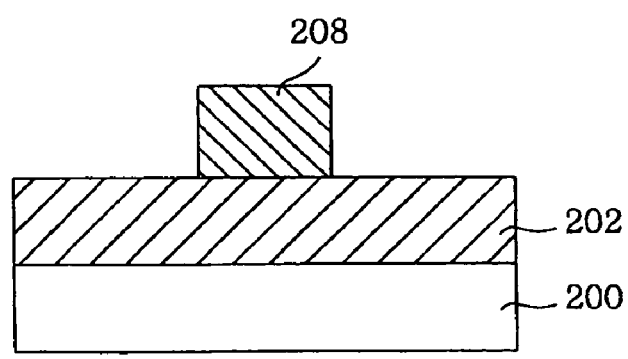

As shown in FIGS. 2B and 2C, the upper insulating layer 204 is etched away using the patterned first photosensitive film 206 as a mask. The upper insulating layer 204 is etched away until a top surface of the lower metal line 202 is exposed. Then the first photosensitive film 206 is removed from the upper insulating layer 204. A nitride film 208 is deposited on the exposed surface of the lower metal line 202 to fill up an etched portion of the upper insulating layer 204. Thereafter, an etchback process is carried out with respect to the nitride film 208 and the upper insulating layer 204 is removed from the lower metal line 202.

Figure 2D:
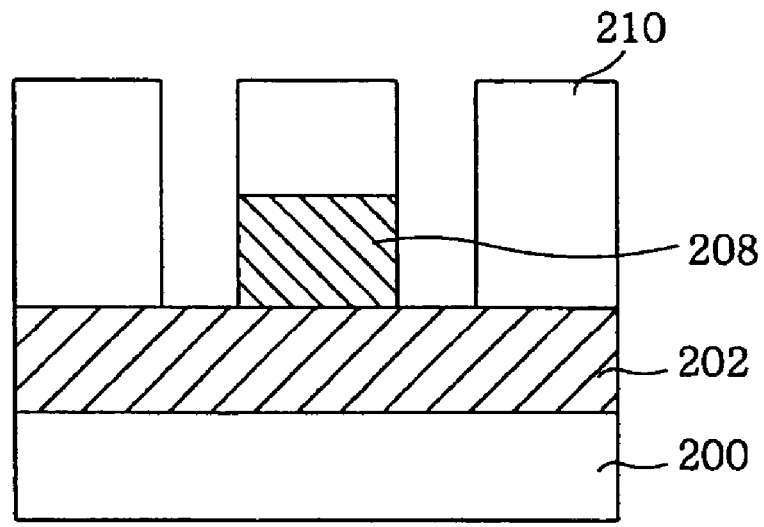

Referring to FIG. 2D, a second photosensitive film 210 is patterned on the structure of FIG. 2C.

Figure 2E:
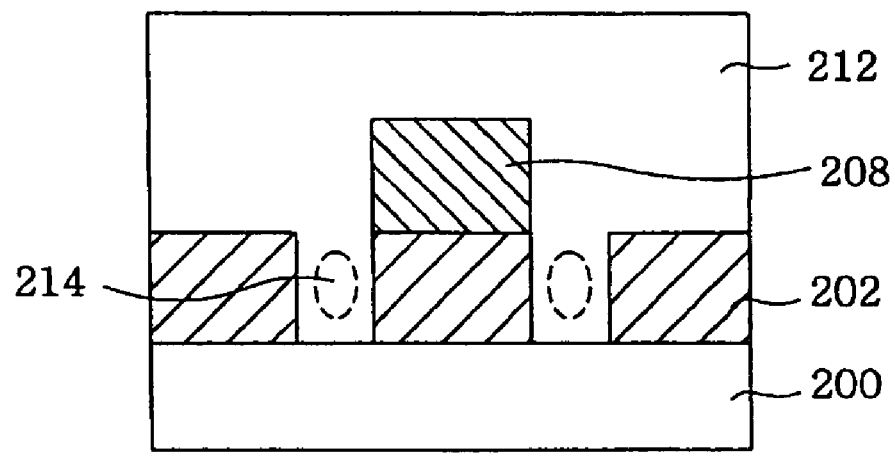

As shown in FIG. 2E, the lower metal line 202 is etched away (using the patterned second photosensitive film 210 as a mask) until a top surface of the lower insulating layer 200 is exposed. The second photosensitive film 210 is then removed. Thereafter, an IMD (Inter Metal Dielectric) layer 212 is deposited over the entire structure, thereby forming an air gap 214 within the IMD layer 212.

Figure 2F:
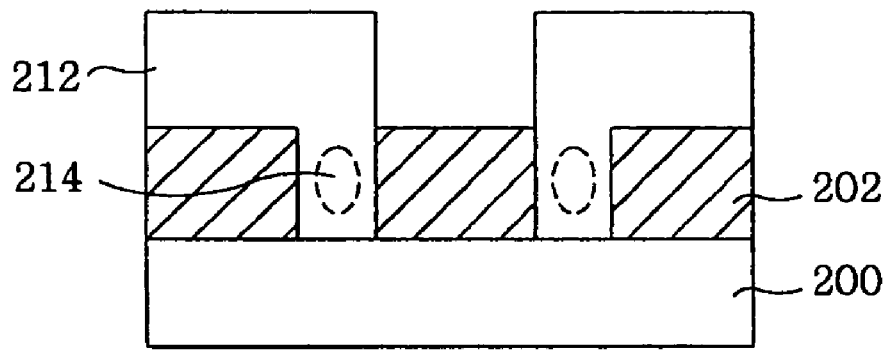

Referring to FIG. 2F, the IMD layer 212 is planarized by a CMP (Chemical Mechanical Polishing) process until a top surface of the nitride film 208 is exposed. Thereafter, the nitride film 208 is etched away by a wet etching, thereby forming a hole in the IMD layer 212.

Figure 2G:
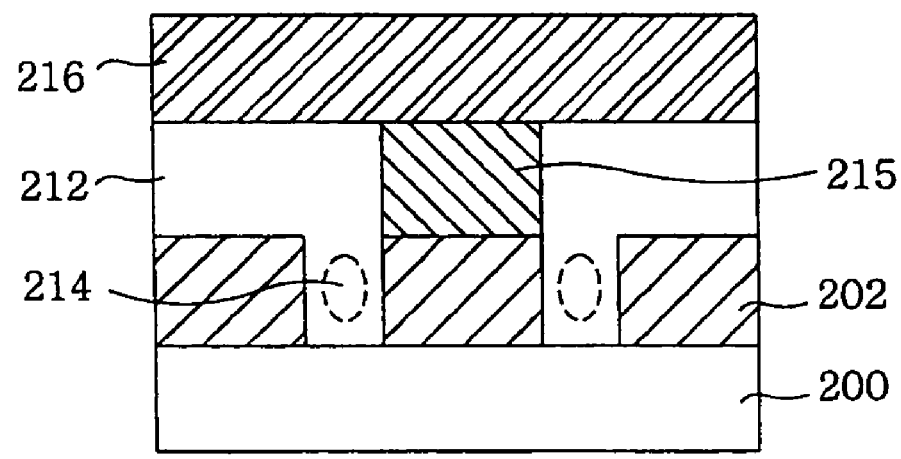

Finally, as shown in FIG. 2G, the hole in the IMD layer 212 is filled with a conductive material 215 for a contact plug. Thereafter, an upper metal line 216 is deposited over the structure. Such processes can be executed by a conventional contact plug process or an Al/Cu damascene process.

An example VLSI semiconductor device constructed in accordance with the above disclosure exhibits low capacitance even if employing a conventionally used material. Further, the delay caused by the RC components can be efficiently improved by forming a stable air gap without the occurrence of metal stringers.

From the foregoing, persons of ordinary skill in the art will appreciate that the above disclosed methods are capable of forming a more stable air gap by constructing both a metal line and a via line on a single object.

For instance, an example method for forming an air gap in a semiconductor metal line manufacturing process, comprises: sequentially stacking a lower insulating layer, a lower metal line and an upper insulating layer; patterning a first photosensitive film on the upper insulating layer, etching the upper insulating layer using the patterned first photosensitive film as a mask until the upper metal line is exposed;

removing the first photosensitive film, filling an etched portion of the upper insulating layer with a nitride film; removing the upper insulating layer; patterning a second photosensitive film on the resultant construct, using the second photosensitive film as a mask to etch the lower metal line until the lower insulating layer is exposed; removing the second photosensitive film; depositing an IMD (Inter Metal Dielectric) layer over the resultant construct, thereby forming an air gap within the IMD layer; planarizing the IMD layer and etching away the nitride film, thereby forming a hole; filling the hole with a conductive material for a contact plug; and depositing an upper metal line over the resultant construct.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a metal line, comprising:
    stacking a lower insulating layer, a lower metal layer and an upper insulating layer;
    patterning a first photosensitive film on the upper insulating layer;
    using the patterned first photosensitive film as a mask, etching the upper insulating layer until at least a portion of the lower metal layer is exposed;
    filling an etched portion of the upper insulating layer with a nitride film;
    patterning a second photosensitive film over the lower metal layer and the nitride film;
    using the second photosensitive film as a mask, etching the lower metal layer until the lower insulating layer is exposed to form a lower metal line pattern;
    depositing an IMD (Inter Metal Dielectric) layer on the lower metal line pattern, including the sidewalls of the lower metal line pattern, the lower insulating layer, and the nitride film, thereby forming an air gap within the IMD layer between lines in the lower metal line pattern;
    planarizing the IMD layer to expose the nitride film;
    removing the nitride film, thereby forming a contact hole in the IMD layer exposing an upper surface of the lower metal line pattern;
    filling the contact hole with a conductive material;
    depositing an upper metal line over the conductive material.

2. A method as defined in claim 1, wherein depositing the upper metal line comprises an Al/Cu damascene process.

3. A method as defined in claim 1, further comprising removing the first photosensitive film after etching the upper insulating layer.

4. A method as defined in claim 3, further comprising removing the upper insulating layer after filling the etched portion of the upper insulating layer with the nitride film and before patterning a second photosensitive film.

5. A method as defined in claim 4, further comprising removing the second photosensitive film before depositing the IMD.

6. A method as defined in claim 1, further comprising, after depositing the IMD and before removing the nitride film, planarizing the IMD layer sufficiently to expose the nitride film.

7. A method as defined in claim 1, wherein the nitride film is removed by wet etching.

* * * * *